(12) United States Patent
Ibata et al.

(10) Patent No.: US 7,834,525 B2
(45) Date of Patent: Nov. 16, 2010

(54) THIN FILM PIEZOELECTRIC TRANSFORMER AND METHOD OF MANUFACTURING THE SAME

(75) Inventors: Masakazu Ibata, Osaka (JP); Fumio Uchikoba, Tokyo (JP)

(73) Assignees: Sharp Kabushiki Kaisha, Osaka-shi (JP); Nihon University, Tokyo (JP)

( * ) Notice: Subject to any disclaimer, the term of this patent is extended or adjusted under 35 U.S.C. 154(b) by 133 days.

(21) Appl. No.: 12/199,061

(22) Filed: Aug. 27, 2008

(65) Prior Publication Data

US 2009/0058229 A1 Mar. 5, 2009

(30) Foreign Application Priority Data

Aug. 28, 2007 (JP) .............. 2007-221487

(51) Int. Cl.
H01L 41/107 (2006.01)
H01L 41/053 (2006.01)
H01L 41/22 (2006.01)

(52) U.S. Cl. ............... 310/351; 310/348; 310/349; 29/25.35

(58) Field of Classification Search ............ 310/348, 310/349, 351; 29/25.35
See application file for complete search history.

(56) References Cited

U.S. PATENT DOCUMENTS

| | | | | |
|---|---|---|---|---|
| 4,027,181 A | * | 5/1977 | Moreillon et al. | 310/348 |
| 5,315,874 A | * | 5/1994 | Petrovich et al. | 73/493 |
| 5,929,553 A | * | 7/1999 | Suzuki et al. | 310/355 |
| 6,250,158 B1 | * | 6/2001 | Stewart | 73/504.14 |
| 6,680,559 B2 | * | 1/2004 | Ishitoko et al. | 310/348 |
| 7,365,477 B2 | * | 4/2008 | Tanaka | 310/348 |
| 2005/0040737 A1 | * | 2/2005 | Tanaya | 310/370 |

FOREIGN PATENT DOCUMENTS

| | | |
|---|---|---|
| JP | 2002-111092 A | 4/2002 |
| JP | 2003-309300 A | 10/2003 |
| JP | 2004-71699 A | 3/2004 |
| JP | 2007-19097 A | 1/2007 |
| KR | 1999-0031153 | 5/1999 |

* cited by examiner

*Primary Examiner*—Thomas M Dougherty
(74) *Attorney, Agent, or Firm*—Birch, Stewart, Kolasch & Birch, LLP

(57) ABSTRACT

A silicon substrate is trimmed in an area at the top and rear surfaces at the center, and a piezoelectric vibrator is disposed therein. As shown in a top view of FIG. 1, the piezoelectric vibrator is supported by a silicon peripheral portion provided on the peripheral portion including the left and right portions of the view having a large thickness, through two beams formed by removing silicon by a known method such as etching. This supported portion corresponds to a node portion. A film structure of the piezoelectric vibrator includes, in thickness directions of the piezoelectric vibrator from the top to the bottom, an Al electrode, a PZT thin film, a Pt underlying electrode, a Ti underlayer, and an $SiO_2$ thin film. Thereby, the piezoelectric vibrator is supported by the beams integrated with the silicon peripheral portion, thus eliminating a mechanical connection and achieving a stable connection.

9 Claims, 8 Drawing Sheets

PZT thin film 17

PZT thin film 17

Pt underlying electrode 16 /
Ti underlayer 15 /
SiO$_2$ thin film 14

Al : 0.3um
PZT : 5um
Pt/Ti : 0.17um
SiO$_2$ : 0.3um

THIN FILM PIEZOELECTRIC TRANSFORMER AND METHOD OF MANUFACTURING THE SAME

BACKGROUND OF THE INVENTION

1. Field of the Invention

The present invention relates to a piezoelectric transformer component suitable for use in a device including multiple voltage circuits and required to be small in size and be highly reliable, such as a portable multimedia device. More particularly, this invention relates to a highly-reliable small-sized piezoelectric transformer component including a silicon substrate and a piezoelectric vibrator made of a piezoelectric thin film formed on the silicon substrate, which are integrally formed in a monolithic structure so as to be easily sealed.

2. Description of the Related Art

There is always a market demand for downsizing electronic devices, and there is also a demand for reducing size and weight of components for use in these devices. This tendency is especially pronounced for portable multimedia devices, which have recently been rapidly widespread, and there is a great demand for reducing size and weight of components for use in these devices.

It is also demanded that such components for use in the portable devices have a high reliability so that the portable devices can operate with stability against shock or the like that occurs during their use.

Meanwhile, an electromagnetic transformer takes the role of performing voltage conversion in an electric circuit. However, the electromagnetic transformer has a structure in which an electric wire is wound in coil form around a core member such as a ferrite core, accordingly is likely to become large in size, and thus has a difficulty in meeting the demand for size reduction.

Thus, a piezoelectric transformer has come into practical use in place of the electromagnetic transformer. The piezoelectric transformer performs voltage conversion, using piezoelectric phenomenon, by temporarily converting an alternating current signal applied to a piezoelectric body into mechanical vibration and then by reconverting the vibration into an electric signal. Since the piezoelectric transformer need not include a winding and thus is simple in structure, it has the advantage of being downsizable. In particular, the piezoelectric transformer has the advantage of being able to achieve height reduction and thus is suitable for a step-up transformer for use in a liquid crystal backlight. Accordingly, the piezoelectric transformer is being used in various applications.

In a typical piezoelectric transformer, a vibrator needs to be supported and sealed therein since the piezoelectric transformer operates by vibrating the piezoelectric body. As can be seen from a configuration disclosed in Japanese Patent Application Publication No. 2003-309300, a ceramic vibrator serving as the vibrator is supported by pressure with a certain component, and is sealed in a resin case. Also, a technique disclosed in Japanese Patent Application Publication No. 2007-19097 achieves the size and thickness reduction of the piezoelectric transformer; however, an element structure of a piezoelectric vibrator is complicated, and thus, the technique presents a problem in terms of reliability.

SUMMARY OF THE INVENTION

As described above, the piezoelectric transformer is used as an element for converting a voltage in the circuit; however, the piezoelectric transformer has the following problems. Specifically, since the vibrator is required to be supported by pressure by use of a certain component, the supporting portion for the ceramic vibrator is likely to be damaged to cause device failure. In addition, the piezoelectric transformer is sealed in a resin case, and the large resin case makes it difficult to downsize the piezoelectric transformer.

The vibrator generates vibration in vibration mode in response to an input frequency. When a structure is employed in which the vibrator is supported in a location where the vibration is prevented, this structure not only causes vibration loss but also makes the conversion of the generated vibration into a predetermined voltage difficult. Accordingly, typically, the vibrator is supported by being sandwiched in a structure by the application of pressure to its vibration node portion.

However, the supporting structure that sandwiches the vibrator therein as mentioned above becomes unstable to external shock or the like, and can possibly reduce the reliability of the piezoelectric transformer. Moreover, if a certain stable support is necessary, a contact area has to be increased. In this case, this affects a vibrating portion of the element, and thus, there is a problem of causing considerable vibration loss.

In the piezoelectric transformer, a factor such as vapor or dust that affects the vibration of the vibrator directly affects characteristics of the piezoelectric transformer, and thus, the element must be sealed. Of course, the scaling structure must not be into contact with the vibrating portion, and thus, a simple sealing structure such as molding or glass bead cannot be employed.

Sealing of the piezoelectric transformer is generally accomplished by enclosing the vibrator structure including the supporting portion with the use of a case made of a resin or the like with one size larger than the vibrator structure. This sealing structure inevitably becomes large and thus makes it difficult to downsize the piezoelectric transformer.

Further, for an electrical connection of the element, it is required that an electrical lead wire be led out through the supporting portion, and that a solder connection portion be provided in any portion of the case, and thus, this has the problem of sacrificing the size reduction in order to achieve both support and sealing of the vibrating component and the reliability at the same time.

The present invention has been made in consideration for the foregoing problems. An object of the present invention is to achieve high reliability by a strong supporting portion and also achieve size reduction by a simple sealing structure.

A piezoelectric element according to the present invention is characterized by a sealing structure in which a vibrating portion is disposed on the center part of a silicon substrate through a silicon beam and a silicon peripheral portion is lidded at its top and bottom.

The transformer component is such that a gap may be provided in the upper portion of a diaphragm structure formed on the silicon substrate and a piezoelectric vibrator may be coupled to the silicon peripheral portion through the beam, and the silicon peripheral portion, the beam and the piezoelectric vibrator are integrally formed by providing the gap in originally the same diaphragm. The piezoelectric vibrator is disposed on the diaphragm formed in the silicon substrate, the gap is formed between the piezoelectric vibrator and the silicon substrate, and the piezoelectric vibrator is fixed in a vibration node portion to the peripheral portion of the silicon substrate through the beam integrally formed with the silicon substrate. Sealing with a sealing member is accomplished by bonding upper and lower sealing members made of resin, glass or the like to the silicon peripheral portion. This yields a piezoelectric transformer component that is firm in structure and stable in characteristics and also is small in size.

In other words, according to one aspect of the present invention, there is provided a piezoelectric transformer including both a piezoelectric vibrator and a supporting structure that supports the piezoelectric vibrator, and the supporting structure is disposed around the piezoelectric vibrator and includes both a peripheral portion having a hollow therein and a beam portion extending from the peripheral portion to a hollow region in which the hollow is formed, and the piezoelectric vibrator is disposed in the hollow region and is supported only by the beam portion.

Preferably, the peripheral portion and the beam portion are made of the same Si material or the like. If Si is used for the substrate, the Si is processed to form a frame. If a material other than Si is used for the substrate, the selected material is used to form the frame. This frame enables the simple formation of the monolithic supporting structure. Preferably, the multiple beam portions are formed spaced apart from one another in a direction crossing a direction in which the beam portions extend. This is characterized by the feature of stabilizing support and also facilitating the formation of an electrode structure given below.

Preferably, the piezoelectric transformer further includes a primary electrode and a secondary electrode formed spaced apart from the primary electrode, which are provided on one surface of the piezoelectric vibrator; and a primary lead electrode led out from under the primary electrode through the beam portion to the peripheral portion, and a secondary lead electrode led out from under the secondary electrode through the beam portion to the peripheral portion, which are provided on the opposite surface to the one surface.

The piezoelectric transformer is characterized in that the thickness of the beam portion lies between 50 µm and 300 µm inclusive. The reason is as follows: a thickness of less than 50 µm may possibly be unable to maintain mechanical strength and hence in some cases may cause damage due to shock or the like, while a thickness of more than 300 µm may possibly affect the vibration of the vibrator and hence in some cases may cause deterioration in characteristics.

A piezoelectric transformer device may be completed by sealing with plate-like sealing members formed on the upper side and the under side of the above-described peripheral portion.

Incidentally, preferably, the piezoelectric vibrator comprises a thin film of piezoelectric zirconate titanate (hereinafter called "PZT"), and the supporting structure comprises a diaphragm obtained by processing a silicon substrate.

According to another aspect of the present invention, there is provided a method of manufacturing a piezoelectric element, including the steps of: forming a recess in one surface of a silicon substrate; depositing a PZT thin film in the recess; forming a surrounding groove in the recess by removing an area surrounding the PZT thin film; and removing the silicon substrate exclusive of both the peripheral portion of the silicon substrate and a beam portion extending from the peripheral portion to a region having the recess formed therein.

Preferably, The method of manufacturing a piezoelectric element further includes the steps of: forming a primary electrode and a secondary electrode spaced apart from each other on one surface of the piezoelectric vibrator; and leading out a primary lead electrode from under the primary electrode through the beam portion to the peripheral portion, and leading out a secondary lead electrode from under the secondary electrode through the beam portion to the peripheral portion, on the opposite surface to the one surface. Preferably, the method of manufacturing a piezoelectric element further includes the step of forming sealing members on the upper side and the under side of the peripheral portion, respectively.

The piezoelectric transformer component of the above-described configuration has a structure excellent in reliability such as impact resistance without having to use such support using pressure as is the case with an existing metallic component, because of having a beam structure integrally formed with the peripheral portion of the silicon diaphragm.

Also, the above-described piezoelectric transformer is sealed by the above-described peripheral portion (i.e., an edge region). This achieves simplification of the sealing structure, thus eliminates the need to build the overall element into a case made of resin or the like, and thus enables size reduction.

The above-described piezoelectric element may be such that multiple piezoelectric elements may be collectively fabricated on a silicon wafer, then a sealing member made of resin, glass or the like having a terminal electrode preformed thereon may be bonded to the wafer, and thereafter the wafer may be divided into individual components.

As described above, the present invention can achieve both the simple supporting structure and sealing. Accordingly, the present invention can enhance the reliability of the piezoelectric element and also achieve the small-sized piezoelectric transformer component.

DETAILED DESCRIPTION OF THE PREFERRED EMBODIMENTS

Figure 1:
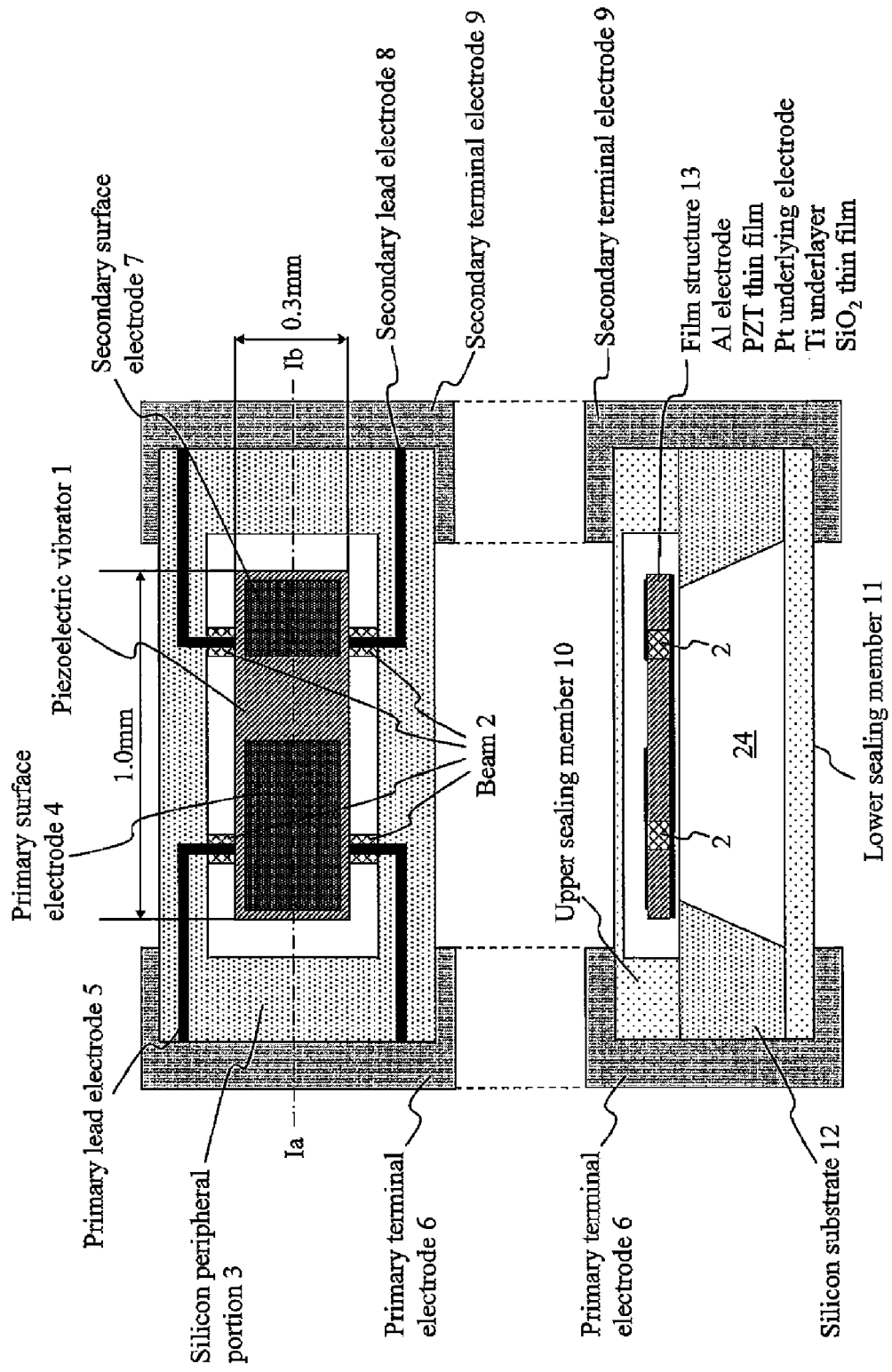
FIG. 1 is a view showing an example of the structure of a piezoelectric transformer according to an embodiment of the present invention, showing a combination of a top view of a piezoelectric element and a sectional view taken along the line Ia-Ib of the top view.

This application is based on the patent application JP2007-221487, all the content of which is incorporated in this application by reference. Description will be given below with reference to the drawings with regard to a piezoelectric element according to one embodiment of the present invention, FIG. 1 is a view showing a silicon substrate etched by wet etching, and description will be given with reference to FIG. 1. In the embodiment, description will be given taking as an example a step-down piezoelectric transformer including a piezoelectric vibrator having a dimension of 1.0 mm by 0.3 mm.

Firstly, description will be given with regard to an example of the structure of the piezoelectric transformer according to the embodiment. FIG. 1 shows a combination of a top view of the piezoelectric element and a sectional view taken along the line Ia-Ib of the top view. As shown in the sectional view in the lower part of FIG. 1, a silicon substrate 12 is trimmed in an area at the top and rear surfaces of the center part, and a piezoelectric vibrator 1 is disposed in the area as shown in FIG. 1. As shown in the top view, the piezoelectric vibrator 1 is supported by a silicon peripheral portion 3 provided on the peripheral portion including the left and right portions of the view, the portions having a relatively great thickness, through two beams 2 formed by removing silicon by a known method such as etching. This supported portion corresponds to a node portion as previously mentioned. A film structure of the piezoelectric vibrator 1 includes, in thickness directions of the piezoelectric vibrator 1 from the top to the bottom, an Al electrode, a PZT thin film, a Pt underlying electrode, a Ti underlayer, and an $SiO_2$ thin film. With the above configuration, the piezoelectric vibrator 1 is supported by the beams 2 integrated with the silicon peripheral portion 3, thus eliminating a mechanical connection and achieving a stable connection.

The silicon peripheral portion 3 is thicker than the piezoelectric vibrator 1, the top surface of the silicon peripheral portion 3 is located higher than the piezoelectric vibrator 1, and the under surface thereof is located lower than the piezoelectric vibrator 1. Resin or glass can be bonded to this portion to form a sealing structure. Alternatively, a sealing member may be recessed and bonded to the silicon peripheral portion at about the same height as the vibrator.

Further, the configuration is such that the piezoelectric vibrator 1 may be provided at one side with a primary surface electrode 4 and at the other side with a secondary surface electrode 7, and that the electrodes 4 and 7 may be led to the silicon peripheral portion 3 by a primary lead electrode 5 and a secondary lead electrode 8, respectively, through the silicon beams 2. Further, the primary lead electrode 5 and the secondary lead electrode 8 are connected to a primary terminal electrode 6 and a secondary terminal electrode 9, respectively, which are disposed at their respective side ends of a sealing member 11. Incidentally, the detailed structure will be clarified by a manufacturing process to be described later.

In an existing general sealing structure, an element is disposed in a case made of resin or the like, and a terminal electrode made of metal is formed in the resin case. Thus, the size reduction of a device is difficult; however, according to the embodiment, it is not necessary to use a case such as a package, thus enabling the size reduction of the overall sealing structure.

Description will be given below with regard to a method of manufacturing the piezoelectric transformer according to the embodiment. For the manufacture of the piezoelectric transformer according to the embodiment, the manufacturing method of a thin film piezoelectric member, a silicon microfabrication technique for the manufacture of MEMS (Micro-Electro Mechanical System), and a patterning technique for a metal thin film or an oxide thin film can be utilized.

Figure 2:
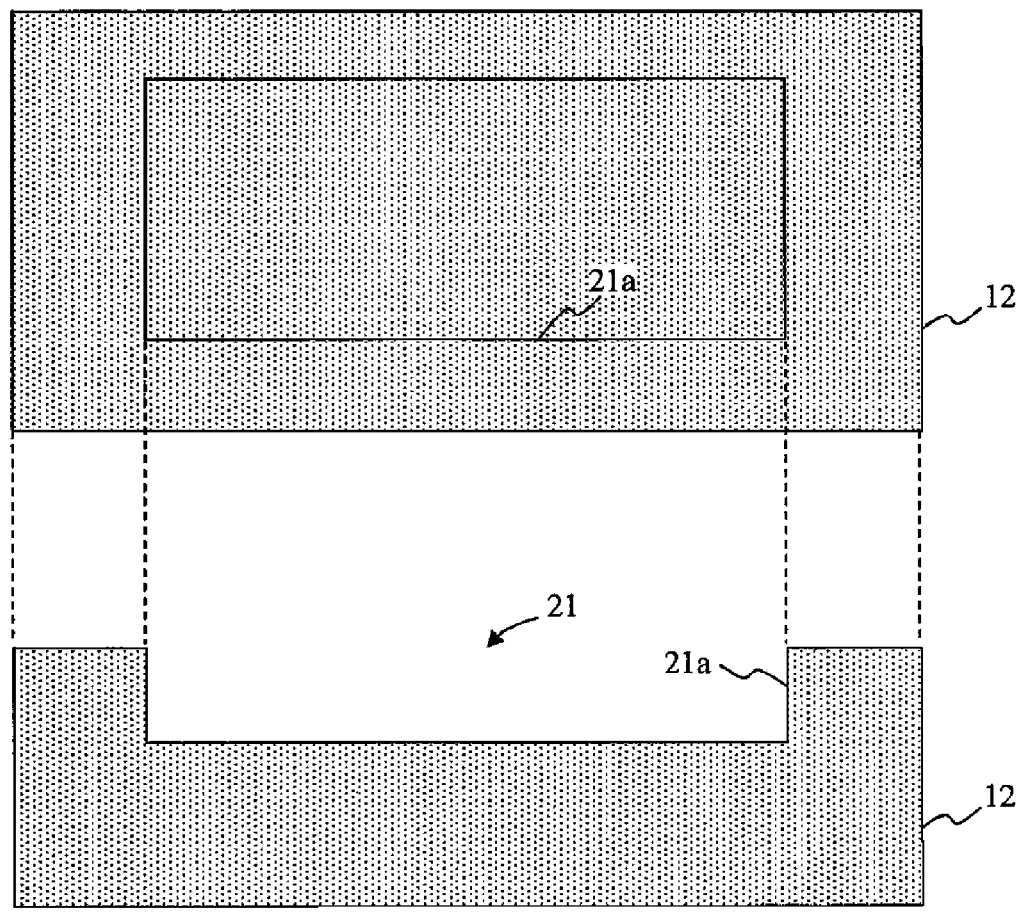
FIG. 2 is a view showing one manufacturing step of the piezoelectric transformer according to the embodiment.

As shown in a plan view (an upper view) and a sectional view (a lower view) in FIG. 2, a recess 21 defined by a given region 21a of the top surface is formed in the silicon substrate 12 by using an etching method such as ICP (Inductively-coupled plasma) dry etching. However, this process may be omitted if a member having a recess originally formed is used as a sealing member.

Figure 3A:
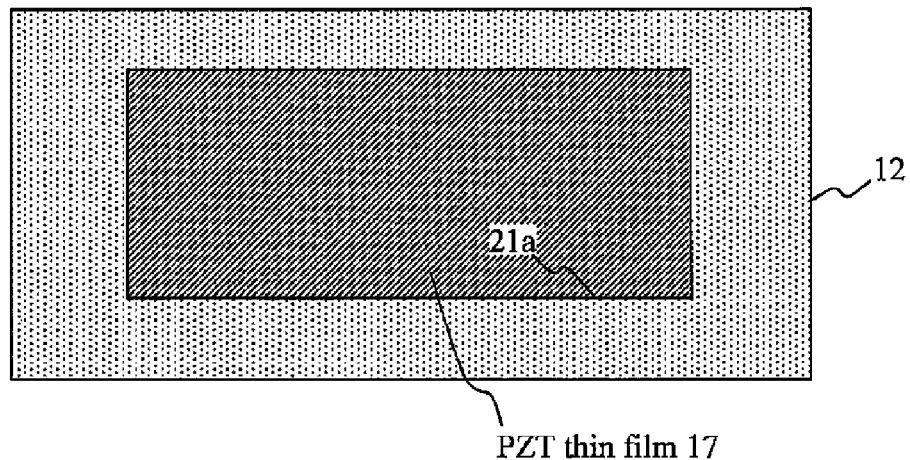
FIGS. 3A and 3B are views showing one manufacturing step of the piezoelectric transformer according to the embodiment.
Figure 3B:
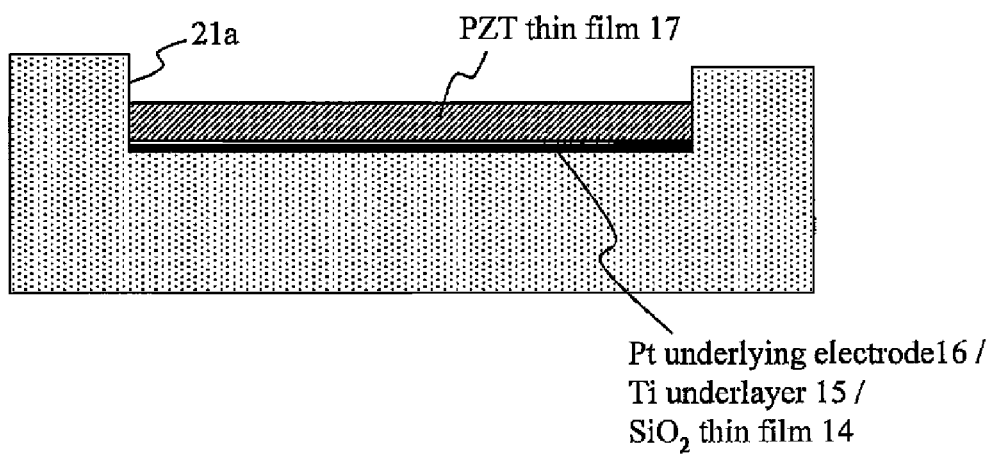

For the formation of the piezoelectric vibrator, as shown in FIG. 3, a PZT (lead zirconate titanate) thin film 17 is formed in the recess 21, which is defined by the region 21a, on the silicon substrate 12 by use of solution phase synthesis such as a sol-gel method or gas phase synthesis such as magnetron sputtering. Prior to this process, a silicon oxide ($SiO_2$) thin film 14, a titanium (Ti) thin film 15 and a platinum (Pt) thin film 16 are formed in order to enhance adhesion between the surface of the silicon substrate and the PZT thin film 17. The conductor layer of Ti or Pt can also be used as an electrode. In a state shown in FIG. 3, the recess is still left in the recessed region 21a.

Figure 4:
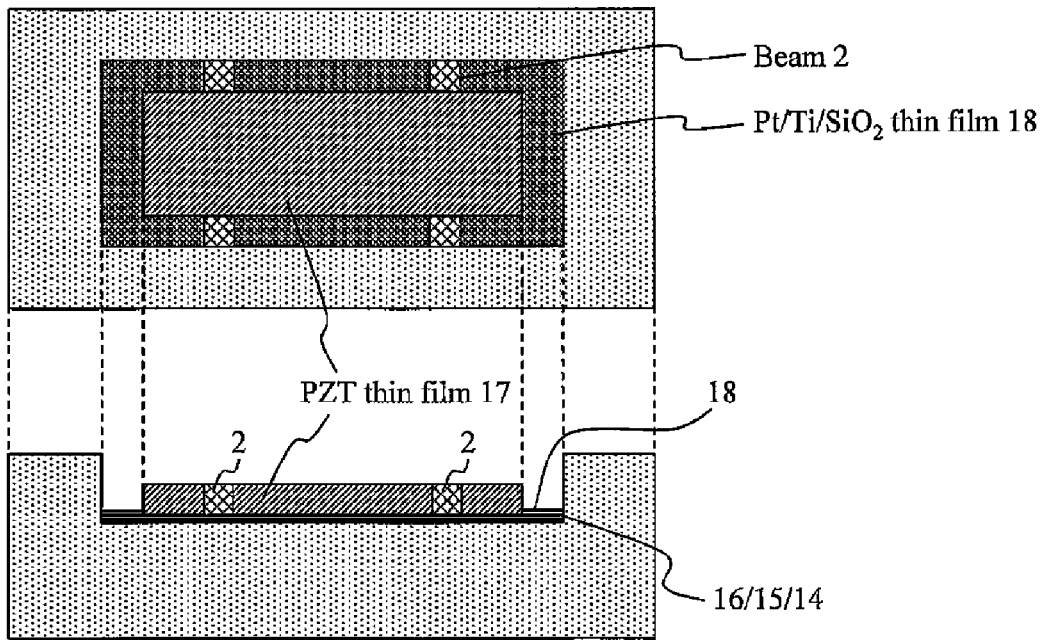
FIG. 4 is a view showing one manufacturing step of the piezoelectric transformer according to the embodiment.

Then, as shown in FIG. 4, the PZT thin film 17 in the recessed region 21a is subjected to patterning into a predetermined shape (in the embodiment, the shape of a rectangular parallelepiped smaller than the recessed region 21a) by using known photolithography technique and etching technique. As an etching method, a method using buffered hydrofluoric acid (HF) is preferable. Preferably, the vibrating portion is subjected to patterning by using a precise photolithography technique so as to achieve dimensional accuracy in order that the vibrating portion can resonate in response to an input signal frequency.

Figure 5:
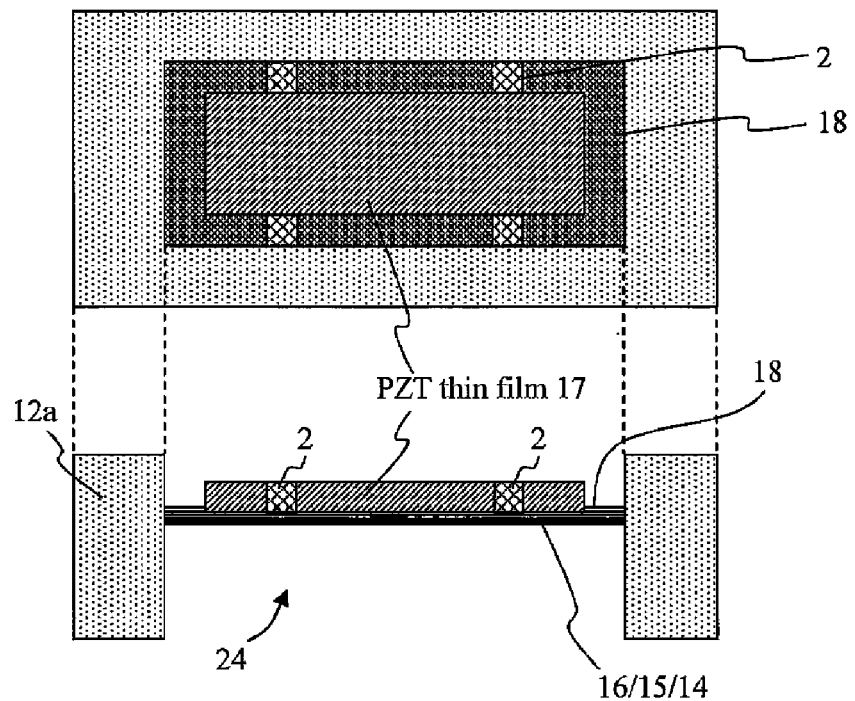
FIG. 5 is a view showing one manufacturing step of the piezoelectric transformer according to the embodiment.
Figure 6:
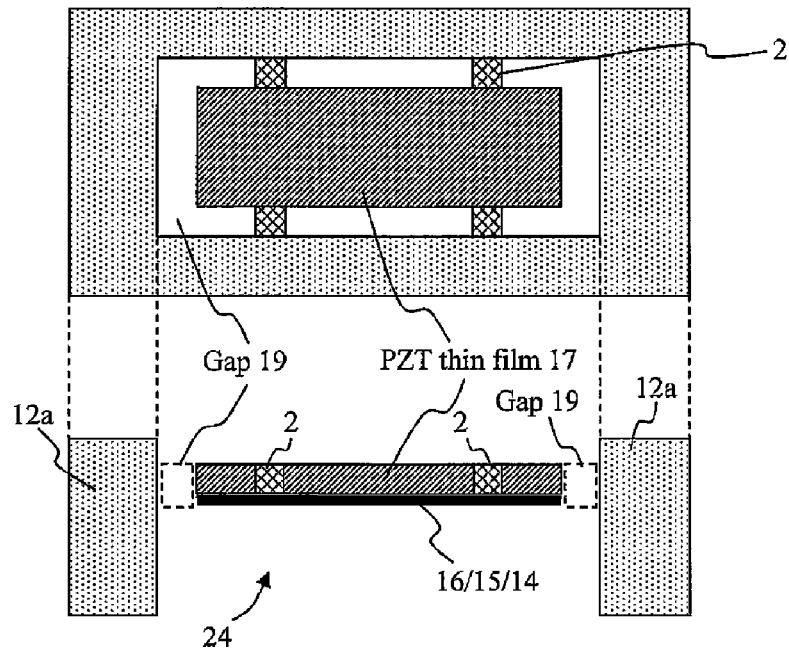
FIG. 6 is a view showing one manufacturing step of the piezoelectric transformer according to the embodiment.

Subsequently, as shown in FIG. 5, a recessed portion 24 of diaphragm shape is formed in the underside of the silicon substrate 12. Also in this case, in the same manner as described above, patterning using a photolithography technique is preferable. However, high-aspect-ratio lithography using an ICP dry etcher is preferable in order to deeply trim the underside of the silicon substrate. Alternatively, potassium hydroxide (KOH) may be used as an etchant to form the recessed portion 24 by anisotropic etching along the silicon (111) surface. In either of these methods, a desired portion of the silicon substrate is subjected to etching, and the etching is caused to be automatically stopped after the $SiO_2$ thin film 14 is exposed. Naturally, the etching may be stopped in mid-flow so that a silicon layer can remain, as needed. Then, in a gap portion 19 between a silicon peripheral portion 12a and the PZT thin film 17, a through-pattern penetrating the gap portion from the top to the bottom is formed as shown in FIG. 6. Specifically, $SiO_2$ is removed by use of photolithography. Using HF as an etchant facilitates removal thereof.

The remaining Ti and Pt are extremely thin layers, and thus, a process for removing $SiO_2$ involves the removal of them; however, photolithography may also be used for the removal.

Figure 7:
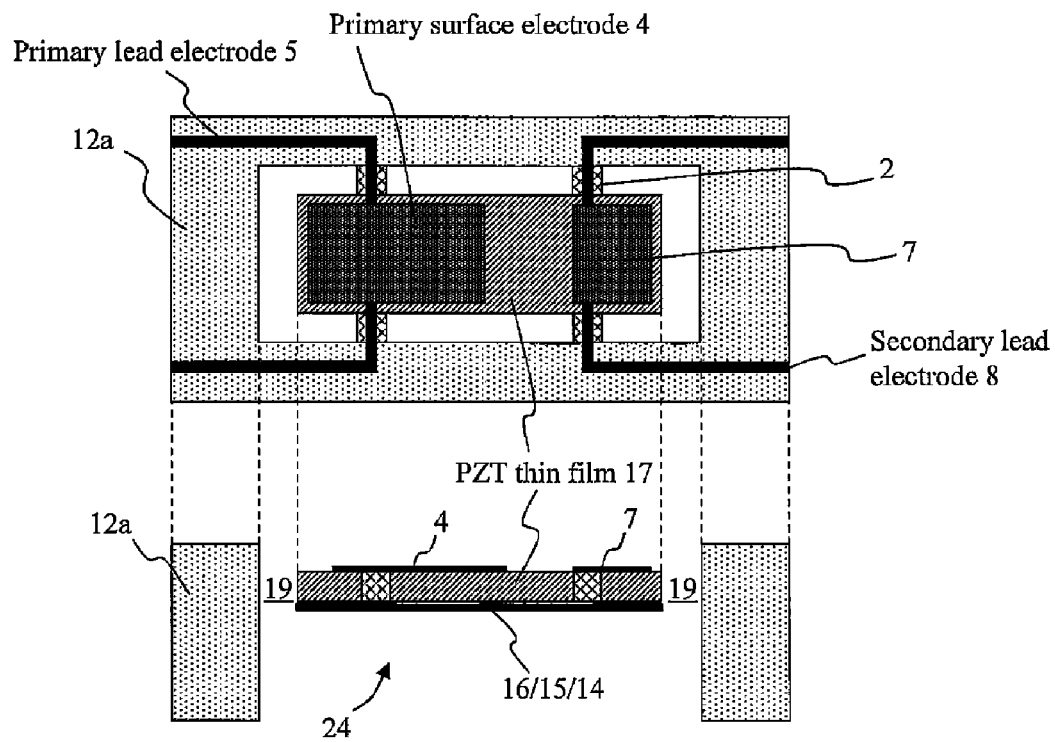
FIG. 7 is a view showing one manufacturing step of the piezoelectric transformer according to the embodiment.

As shown in FIG. 7, the silicon peripheral portion 12a is used as a frame to form the primary lead electrode 5 and the secondary lead electrode 8, and the primary surface electrode 4 and the secondary surface electrode 7 of the piezoelectric vibrator. The primary surface electrode 4 and the secondary surface electrode 7 are formed, being separated from each other, on the top surface of the piezoelectric vibrator, and the primary lead electrode 5 and the secondary lead electrode 8 are formed along and on both the beams 2 and the silicon peripheral portion 12a, from the electrodes 4 and 7, respectively. The primary lead electrode 5 and the secondary lead electrode 8 are formed on the back surface of the piezoelectric vibrator. The formation of these electrodes both on the front and back surface sides can be accomplished by forming a conductive pattern made of aluminum, and by patterning using a photolithography technique.

Then, the formed electrodes of the piezoelectric vibrator are subjected to a voltage to undergo a polarization process for a piezoelectric material. This polarization process can be performed by a method in which the directions of polarization of crystals formed of polycrystal are arranged in a predetermined direction. In the embodiment, a voltage is applied in two directions, that is, to a portion in thickness directions and a portion in a longitudinal direction. After that, an aluminum electrode is formed by patterning for the formation of the back surface electrode; however, if the electrode for polarization can be directly used, this process is unnecessary.

Figure 8:
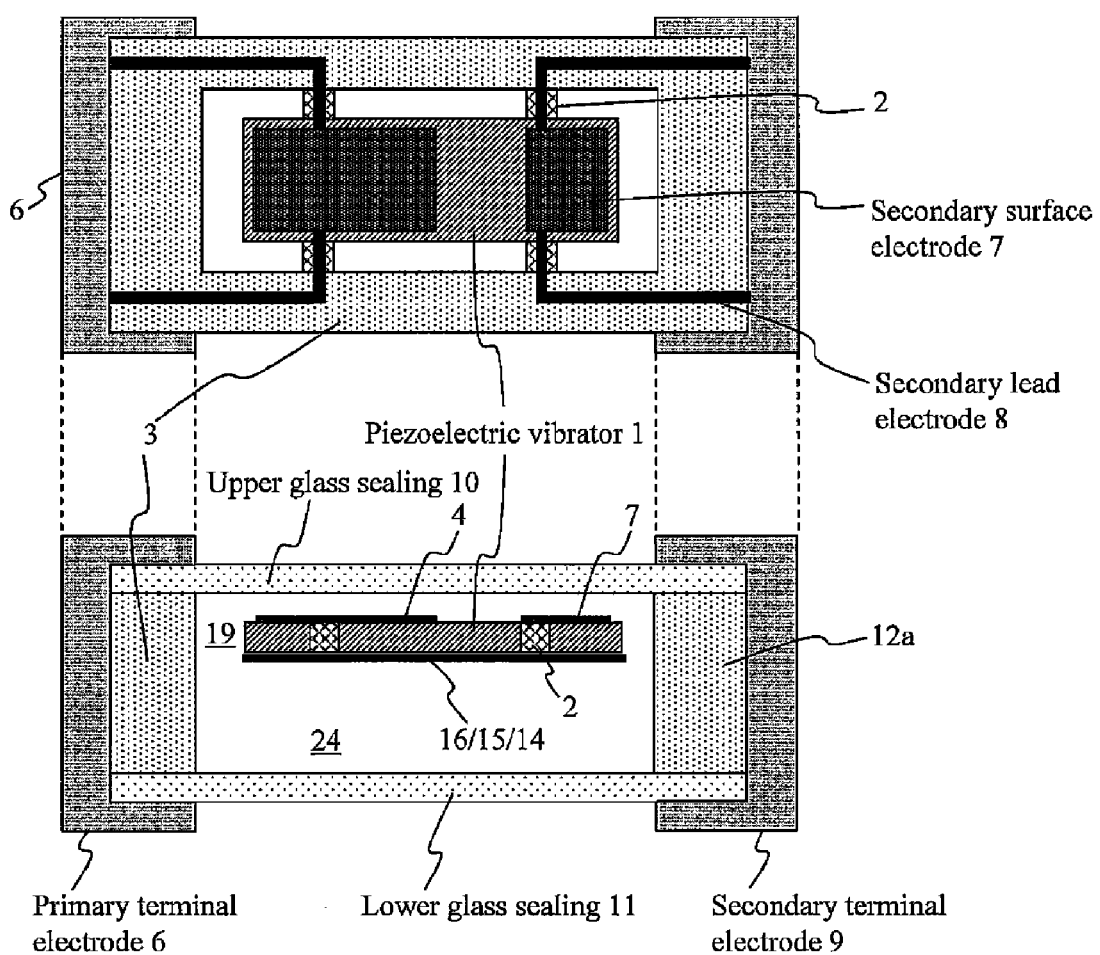
FIG. 8 is a view showing one manufacturing step of the piezoelectric transformer according to the embodiment.

Then, as shown in FIG. 8, electrode patterns for soldering are formed on upper and lower sealing members 10 and 11 made of glass, resin or the like. For a process for forming the electrode patterns, it is preferable to use a plating method for thin film formation so as to form copper, nickel and tin layers.

For bonding to the resin, a temperature is increased to the vicinity of a glass transition point Tg of the resin so that the softened resin can be bonded, and performing this process in vacuum has the effect of further promoting adhesion. An epoxy-base material is used as the resin, and a filler can be put in the resin so as to reduce a coefficient of thermal expansion and to increase strength, and thus, it is preferable to use glass powder or silicon powder as the filler.

On the other hand, when glass is used as a sealing member, it is preferable to use Pilex glass (Trade mark), and vacuum anodic bonding can be performed for adhesive bonding.

The above-described method has the advantage of excelling in mass production, since the elements can be formed by this method without having to divide the silicon substrate, sealed collectively and then divided into individual components.

Incidentally, it is to be understood that the embodiment is illustrative only for easy understanding of the present invention and is not intended to limit the scope of the invention defined in the claims. Also, it is to be understood that structural elements described in the embodiment may include all design changes and equivalents belonging to the technical scope of the invention and various preferred modifications may be made in the invention. For example, the number of piezoelectric vibrators built in is not limited to one, and multiple piezoelectric vibrators may be collectively contained. One feature of the present invention is that the sealing member ensures space (or gap) having high hermeticity for the piezoelectric vibrator, and more specific forms can include various forms.

Description will be given below with reference to the drawings with regard to an example of the present invention.

Example 1

Figure 9A:
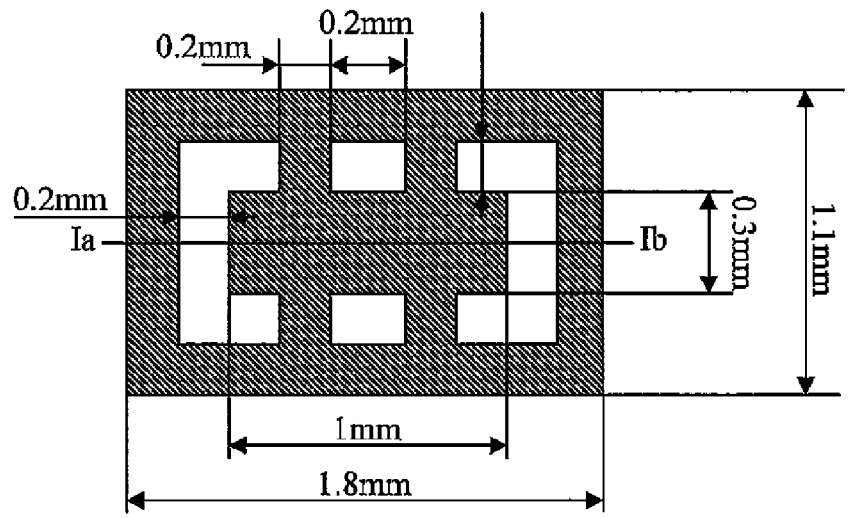
FIGS. 9A to 9C are views showing an example of dimensions of the fabricated piezoelectric transformer.
Figure 9B:
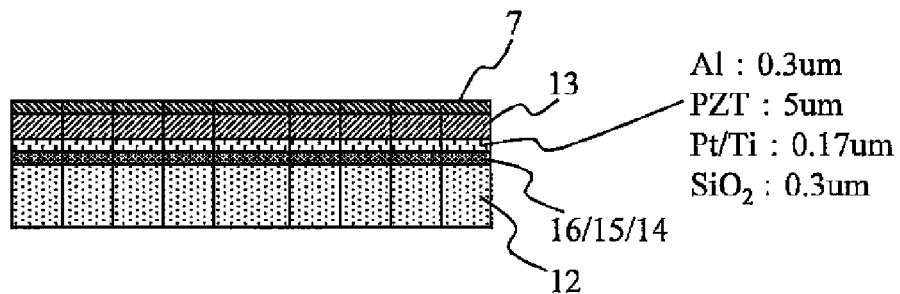
Figure 9C:
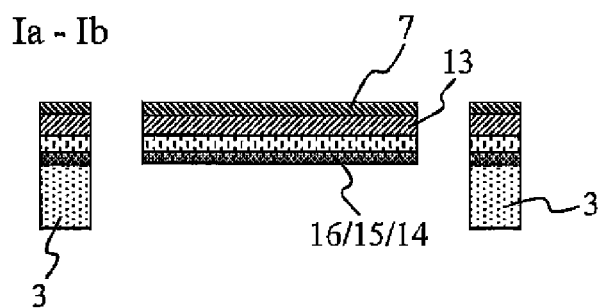

Description will be given below with reference to the drawings with regard to a more specific example of the present invention. Firstly, description will be given with regard to verification results of operations of a piezoelectric transformer component including the element having the structure shown in FIG. 1, the piezoelectric transformer component being manufactured by the above-described method. Description will be given with reference to FIGS. 9A to 9C with regard to dimensions of the fabricated piezoelectric transformer. FIGS. 9A to 9C are views showing a silicon substrate etched by dry etching, and a moving part has a structure in which a rectangle of 0.3 mm by 1.0 mm is supported by four beams with a width of 0.2 mm. The outer circumference has a dimension of 1.8 mm by 1.1 mm. Film thicknesses are as follows: silicon is 400 μm; $SiO_2$, 0.3 μm; Ti, 0.02 μm; Pt, 0.15 μm; PZT, 5 μm; and Al, 0.3 μm. These were subjected to a sealing process, so that the overall thickness was 1 mm. First, the silicon substrate 12 with a thickness of 400 μm was cleaned, and then, an $SiO_2$ film was formed by use of a thermal oxidation method. Then, Ti and Pt layers were formed by an RF sputtering method. A sol-gel method was used for the formation of PZT. The silicon substrate was coated with a PZT alkoxide solution by spin coating method and was then dried, and spin coating and drying were repeated until a predetermined thickness was obtained. Thereafter, the silicon substrate was baked to form a PZT film with a thickness of 5 μm by use of an RTA (Rapid Thermal Annealing) method.

The surface of the PZT film was coated with a photoresist, and a predetermined pattern was formed by lithographic exposure and development to form a resist pattern. Then, the PZT was processed into a predetermined pattern by etching using buffered HF. Then, the resist was removed, and a wafer was cleaned and dried.

Subsequently, the under side of the silicon substrate 12 was coated with a photoresist by spin coating, and was subjected to a drying process. Prior to ICP dry etching, a photoresist film was subjected to a prebake process in order to strengthen a resist film. So-called Bosch process was used as the ICP dry etching method. This is a method in which sulfur hexafluoride ($SF_6$) that acts as etching gas and octafluorocyclobutane ($C_4F_8$) that acts as a protective film are alternately used, and this method enables etching with a high aspect ratio.

After that, the $SiO_2$ film corresponding to the gap was removed by use of a photolithography method. On that occasion, the surface was subjected to patterning using a photoresist and was processed by use of HF. At this time, the gap portion 19 is formed, and also, $SiO_2$ on the under side of the vibrator can be dissolved.

After that, impregnation with nitric acid took place to remove a metal layer on the back surface. After that, the resist was exfoliated, and cleaning and drying processes were performed. As a process for forming the polarization electrode and the lead electrode, aluminum thin films were vacuum deposited on the upper side and the under side of the Si substrate, and then pattern formation was performed by photolithography method. The polarization was accomplished by applying respective voltages to the terminals 5 and 6 for 20 minutes by use of a direct-current stabilized power supply. On this occasion, the direction of polarization was as follows: a voltage of 10 V was applied so that an input primary portion would be polarized in thickness directions, while a voltage of 100 V was applied so that an output secondary portion would be polarized in the longitudinal direction. A micro-probe was used for electrical connection for the application of voltages.

After that, a secondary bottom aluminum electrode and a lead conductor layer were formed in the same manner as described above by using a photolithography technique.

An impression of the same size as the silicon peripheral portion was formed, by use of a mold, in a sheet formed in a sheet form by mixing a glass filler into an epoxy-base resin. A hole was formed in a portion where the terminal electrode is to be formed, further an electrode portion was formed by vacuum deposition, and membranes made of copper, nickel and tin were formed by electroplating. This was placed on a silicon wafer, which in turn was put in a plastic bag. The plastic bag was degassed so as to have vacuum state therein, and then, the plastic bag was placed on a press heated at 70 degrees and was bonded at a total pressure of 1 MPa. Further, the wafer was divided into individual elements (or pieces) by use of a dicing machine. A sample subjected to the same process using a glass sheet in place of the epoxy resin was also prepared. In this instance, a vacuum anodic bonding apparatus was used for a bonding process.

Figure 10:
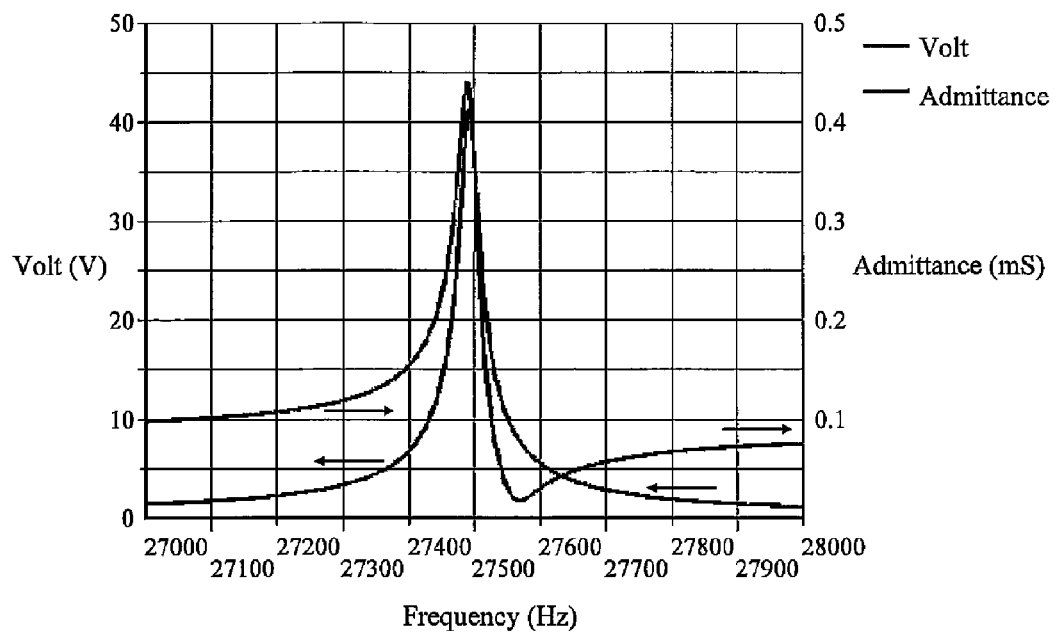
FIG. 10 is a graph showing an example of characteristics of the fabricated element.
Figure 11:
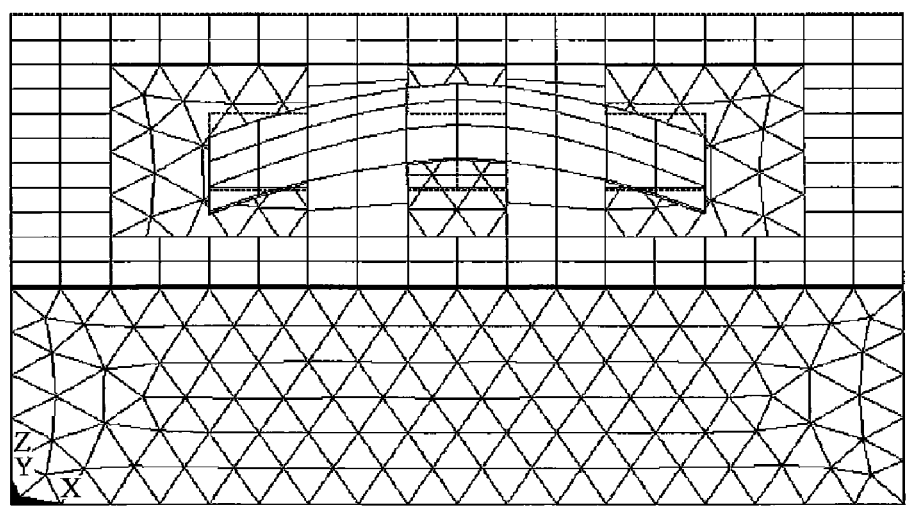
FIG. 11 is a view showing the state of the fabricated element in vibration mode.

FIG. 10 is a graph showing an example of characteristics of the fabricated element. It can be seen that the application of an input voltage of 100 V produces an output of about 45 V, and that a step-down conversion takes place. This element exhibits resonance characteristics that are almost equivalent to those of an existing element (incidentally, comparison with the electromagnetic transformer is impossible because the electromagnetic transformer does not have the resonance characteristics). Further, FIG. 11 shows the state of the element in the vibration mode. It can be seen that the node portion can be substantially supported, and that the vibration mode is a single fundamental vibration mode that does not involve a parasitic vibration.

As described above, the piezoelectric element according to the embodiment has the advantage of having a simple mechanism for supporting the moving part. Also, the piezoelectric transformer of simple structure can be achieved without the need for the case.

The present invention is applicable for the piezoelectric element.

EXPLANATION OF REFERENCE NUMERALS

1 ... piezoelectric vibrator, 2 ... silicon beam, 3 ... silicon peripheral portion, 4 ... primary surface electrode, 5 ... primary lead electrode, 7 ... secondary surface electrode, 8 ... secondary lead electrode

What is claimed is:

1. A piezoelectric transformer device, wherein plate-like sealing members are respectively formed on upper and under sides of the peripheral portion of a piezoelectric transformer to seal the piezoelectric transformer, the piezoelectric transformer, comprising:
a piezoelectric vibrator; and
a supporting structure supporting the piezoelectric vibrator,
wherein the supporting structure is disposed around the piezoelectric vibrator, and includes:
a peripheral portion having a hollow therein, and
a beam portion extending from the peripheral portion to a hollow region in which the hollow is formed, and
the piezoelectric vibrator is disposed in the hollow region and is supported only by the beam portion.

2. The piezoelectric transformer according to claim 1, wherein the peripheral portion and the beam portion are made of the same Si material.

3. The piezoelectric transformer according to claim 1, wherein a plurality of aforementioned beam portions are formed spaced apart from one another in a direction crossing a direction in which the beam portions extend.

4. The piezoelectric transformer according to claim 1, wherein the thickness of the beam portion lies between 50 μm and 300 μm inclusive.

5. The piezoelectric transformer device according to claim 1, wherein the piezoelectric vibrator comprises a thin film of lead zirconate titanate ($Pb(Zr_{1-x}Ti_x)O_3$, hereinafter called "PZT"), and the supporting structure comprises a diaphragm obtained by processing a silicon substrate.

6. A piezoelectric transformer, comprising:
a piezoelectric vibrator;
a supporting structure supporting the piezoelectric vibrator,
wherein the supporting structure is disposed around the piezoelectric vibrator, and includes:
a peripheral portion having a hollow therein, and
a beam portion extending from the peripheral portion to a hollow region in which the hollow is formed, and
the piezoelectric vibrator is disposed in the hollow region and is supported only by the beam portion;
a primary electrode;
a secondary electrode formed spaced apart from the primary electrode, the primary and secondary electrodes provided on one surface of the piezoelectric vibrator;
a primary lead electrode led out from under the primary electrode through the beam portion to the peripheral portion; and
a secondary lead electrode led out from under the secondary electrode through the beam portion to the peripheral portion, the primary and secondary electrodes provided on the opposite surface to the one surface.

7. A method of manufacturing a piezoelectric element, comprising the steps of:
forming a recess in one surface of a silicon substrate;
depositing a PZT thin film in the recess;
forming a surrounding groove in the recess by removing an area surrounding the PZT thin film; and
removing the silicon substrate exclusive of both its peripheral portion and a beam portion extending from the peripheral portion to a region having the recess formed therein.

8. The method of manufacturing a piezoelectric element according to claim 7, further comprising the steps of:
forming a primary electrode and a secondary electrode spaced apart from each other on one surface of the piezoelectric vibrator; and
leading out a primary lead electrode from under the primary electrode through the beam portion to the peripheral portion, and leading out a secondary lead electrode from under the secondary electrode through the beam portion to the peripheral portion, on the opposite surface to the one surface.

9. The method of manufacturing a piezoelectric element according to claim 7, further comprising the step of forming sealing members on upper and under sides of the peripheral portion, respectively.

* * * * *